(12) United States Patent
Kubo et al.

(10) Patent No.: US 11,315,889 B2
(45) Date of Patent: Apr. 26, 2022

(54) ELECTRONIC DEVICE

(71) Applicant: DEXERIALS CORPORATION, Tokyo (JP)

(72) Inventors: Yusuke Kubo, Tochigi (JP); Sergey Bolotov, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 17/053,248

(22) PCT Filed: Jun. 18, 2019

(86) PCT No.: PCT/JP2019/024173
§ 371 (c)(1),
(2) Date: Nov. 5, 2020

(87) PCT Pub. No.: WO2020/004157
PCT Pub. Date: Jan. 2, 2020

(65) Prior Publication Data
US 2021/0296264 A1  Sep. 23, 2021

(30) Foreign Application Priority Data
Jun. 26, 2018 (JP) .............................. JP2018-121354

(51) Int. Cl.
*H01L 23/60* (2006.01)
*H01L 23/367* (2006.01)
(Continued)

(52) U.S. Cl.
CPC ............ *H01L 23/60* (2013.01); *H01L 23/367* (2013.01); *H01L 23/49838* (2013.01);
(Continued)

(58) Field of Classification Search
CPC . H01L 23/60; H01L 23/367; H01L 23/49838; H01L 23/552; H01L 23/66; H01L 2223/6627; H01P 3/081
See application file for complete search history.

(56) References Cited

U.S. PATENT DOCUMENTS

2010/0091460 A1*  4/2010  Hinze ................ H01L 23/4006
                                                         361/709
2014/0177181 A1*  6/2014  Malek ...................... H05K 3/30
                                                          361/749

FOREIGN PATENT DOCUMENTS

JP         2011-155056 A         8/2011

OTHER PUBLICATIONS

Nov. 10, 2021, Korean Office Action issued for related KR application No. 10-2020-7029007.

* cited by examiner

*Primary Examiner* — Peniel M Gumedzoe
(74) *Attorney, Agent, or Firm* — Paratus Law Group, PLLC

(57) ABSTRACT

Provided is an electronic device capable of simultaneously achieving heat dissipation, electromagnetic wave suppression effect and ESD protection at a high level. The device includes: an electronic component 30 provided on a substrate 31; an electrically conductive shielding can 20 having an opening 21 and provided so as to surround the electronic component 30 and connected to a ground 32; an electrically conductive cooling member 40 provided on the top of the electrically conductive shielding can 20; a thermally and electrically conductive sheet 10 provided between the electronic component 30 and the electrically conductive cooling member 40; and an insulating member 50 provided between the thermally and electrically conductive sheet 10 and the electrically conductive cooling member 40 and facing the (Continued)

electronic component 30 through the opening 21, wherein the insulating member 50 has a size equal to or larger than the region of the electronic component 30 facing through the opening 21, and the electrically conductive shielding can 20 and the electrically conductive cooling member 40 are electrically connected through the thermally and electrically conductive sheet 10.

16 Claims, 8 Drawing Sheets

(51) Int. Cl.
    *H01L 23/498*     (2006.01)
    *H01L 23/552*     (2006.01)
    *H01L 23/66*     (2006.01)
    *H01P 3/08*     (2006.01)

(52) U.S. Cl.
    CPC ............ *H01L 23/552* (2013.01); *H01L 23/66* (2013.01); *H01P 3/081* (2013.01); *H01L 2223/6627* (2013.01)

ELECTRONIC DEVICE

TECHNICAL FIELD

The present technology relates to an electronic device having excellent heat dissipation, electromagnetic wave suppression, and electrostatic discharge properties and is particularly suitable for use in a semiconductor device. This application is a National Stage Patent Application of PCT International Patent Application No. PCT/JP2019/024173 filed on Jun. 18, 2019 under 35 U.S.C. § 371, which claims priority on the basis of Japanese Patent Application No. 2018-121354, filed on Jun. 26, 2018, in Japan, which is incorporated by reference herein.

BACKGROUND ART

In recent years, while electronic devices tends to be miniaturized, since the power consumption cannot be changed so much due to the diversity of applications, measures for heat dissipation in the equipment have become more important.

As measures for heat dissipation in the electronic devices, a heat radiator plate made of a metal material having a high thermal conductivity such as copper or aluminum, a heat pipe, a heat sink, and the like are widely used. These heat dissipating components having excellent thermal conductivity are arranged so as to be close to electronic components such as a semiconductor package which is a heat generating component in the electronic device in order to achieve a heat dissipating effect or temperature relaxation in the device. These heat dissipating components having excellent thermal conductivity are disposed from the electronic components which are heat generating components to a place of low temperature.

However, the heat generating component in the electronic device is an electronic component such as a semiconductor device having a high current density; the fact that the current density is high implies that the electric field strength or the magnetic field strength, which can be a component of unwanted radiation, is large. Therefore, a heat dissipating component made of metal disposed in the vicinity of the electronic component not only absorbs heat, but also causes a problem by picking up a harmonic component of the electric signal flowing in the electronic component. Specifically, since the heat dissipating component is made of a metal material, the heat dissipating component itself functions as an antenna for a harmonic component or as a transmission path for a harmonic noise component.

Therefore, it is desired to develop a technology that achieves both heat dissipation and electromagnetic wave suppression effects. For example, Patent Document 1 discloses a technology in which a shielding case for covering an electronic component mounted on a printed board having a hole for a fin and a heat dissipation fin are provided, and a part of the heat dissipation fin is exposed to the outside of the shielding case via the hole for the fin.

However, although the technology disclosed in Patent Document 1 can secure a certain level of heat dissipation, because the hole for the fin is provided in the shielding case, it is considered that the electromagnetic wave suppression effect cannot be sufficiently obtained and both of the heat dissipation and the electromagnetic wave suppression effect cannot be achieved simultaneously.

Furthermore, when a charged human body touches an electronic device, the accumulated static electricity might be discharged into the electronic device, which causes malfunction or damage to electronic components such as semiconductor devices, so that ESD (electro-static discharge) protection measures are also required in addition to the above measures for heat dissipation and electromagnetic wave suppression.

PRIOR ART REFERENCE

Patent Reference

Patent Document 1: Japanese Unexamined Patent Application Publication No. 2011-155056

SUMMARY OF THE INVENTION

Problem to be Solved by the Invention

In view of the above, it is an object of the present invention to provide an electronic device having excellent heat dissipation properties and electromagnetic wave suppression effects and provided with ESD protection properties.

Means of Solving the Problem

The present inventors have studied the above problem repeatedly, and have found the fact that heat dissipation properties can be improved by providing an electrically conductive shielding can connected to a ground so as to cover the electronic component, and that excellent electromagnetic wave absorption performance can also be achieved without degrading the electromagnetic wave absorption performance by providing an opening in the electrically conductive shielding can and forming a thermally and electrically conductive sheet at least through the opening to connect the electronic component and the cooling member. Furthermore, present inventors also found that ESD protection can be simultaneously realized in addition to heat dissipation and electromagnetic wave suppression by arranging an insulating member at a predetermined position in order to provide effective ESD protection. As a result, the electronic device according to the present technology can simultaneously realize heat dissipation, electromagnetic wave suppression effect, and ESD protection at a high level.

The present technology is based on the above findings and an electronic device according to the present technology includes: an electronic component provided on a substrate; an electrically conductive shielding can having an opening and provided so as to surround the electronic component and connected to a ground; an electrically conductive cooling member provided on an upper portion of the electrically conductive shielding can; a thermally and electrically conductive sheet provided between the electronic component and the electrically conductive cooling member; and an insulating member provided between the thermally and electrically conductive sheet and the electrically conductive cooling member and facing the electronic component through the opening, wherein the insulating member has a size equal to or larger than a region of the electronic component facing the insulating member through the opening, and wherein the electrically conductive shielding can is electrically connected to the electrically conductive cooling member through the thermally and electrically conductive sheet.

Effects of the Invention

According to the present technology, it is possible to provide an electronic device capable of simultaneously achieving heat dissipation, electromagnetic wave suppression, and ESD protection measures at a high level.

MODE FOR CARRYING OUT THE INVENTION

Figure 1:
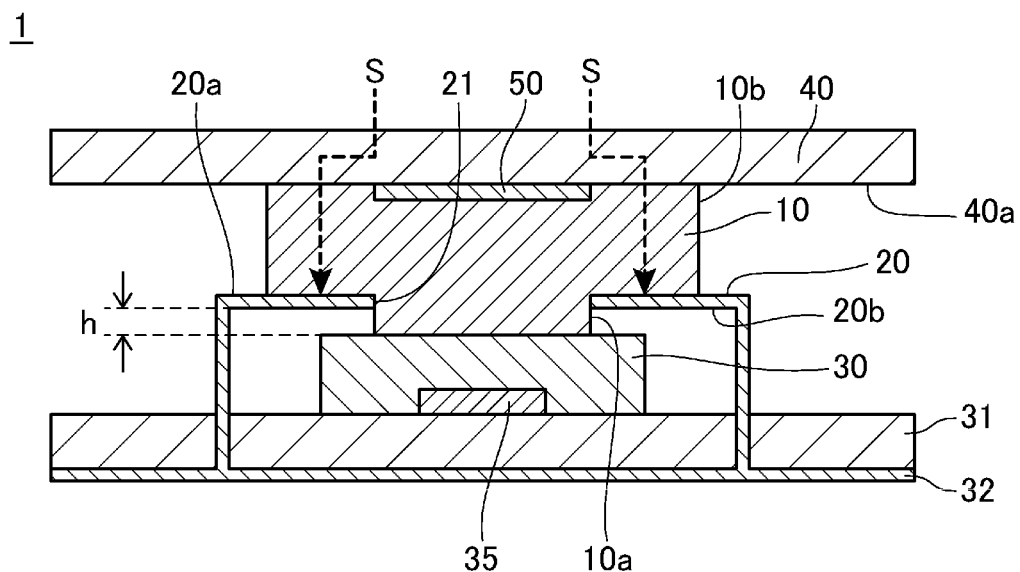
FIG. 1 is a cross-sectional view of a semiconductor device shown as an example of an electronic device according to the present technology.

Hereinafter, an electronic device according to the present technology will be described in detail with reference to the drawings. It should be noted that the present technology is not limited to the following embodiments and various modifications can be made without departing from the scope of the present technology. Moreover, the features illustrated in the drawings are shown schematically and are not intended to be drawn to scale. Actual dimensions should be determined in consideration of the following description. Furthermore, those skilled in the art will appreciate that dimensional relations and proportions may be different among the drawings in certain parts.

In the following, an example of an electronic device according to the present technology will be described with reference to a semiconductor device using a semiconductor element as an electronic component. As shown in FIG. 1, a semiconductor device 1 according to the present technology includes a semiconductor element 30, an electrically conductive shielding can 20, an electrically conductive cooling member 40, an insulating member 50, and a thermally and electrically conductive sheet 10.

The semiconductor device 1 includes the electrically conductive shielding can 20 having an opening 21 and provided so as to surround the semiconductor element 30, and the thermally and electrically conductive sheet 10 is formed between the semiconductor element 30 and the electrically conductive cooling member 40.

The semiconductor element 30 can be a source of heat and electromagnetic waves; however, by providing the electrically conductive shielding can 20 so as to surround the semiconductor element 30, connecting the electrically conductive shielding can 20 to a ground 32, providing the thermally and electrically conductive sheet 10 around the opening 21 of the electrically conductive shielding can 20, and connecting the electrically conductive cooling member 40 through the thermally and electrically conductive sheet 10, the ground 32, the electrically conductive shielding can 20, the thermally and electrically conductive sheet 10, and the electrically conductive cooling member 40 forms a virtual shielding can for shielding the semiconductor element 30, so that electromagnetic waves are shielded, thereby achieving an excellent electromagnetic wave suppressing effect.

Further, by forming the opening 21 in the electrically conductive shielding can 20 and providing the thermally and electrically conductive sheet 10 having high thermal conductivity between the semiconductor element 30 and the electrically conductive cooling member 40, thermal conduction to the electrically conductive cooling member 40 is greatly improved, and as a result, excellent heat dissipation can also be realized.

The semiconductor device 1 is characterized in that the insulating member 50 is provided between the semiconductor element 30 and the electrically conductive cooling member 40, so that the semiconductor element 30 and the insulating member 50 face each other through the opening 21.

The thermally and electrically conductive sheet 10 efficiently transmits heat generated by the semiconductor element 30 to the electrically conductive cooling member 40, while there is a possibility that static electricity discharged to the electrically conductive cooling member 40 flows into the semiconductor element 30. However, in the semiconductor device 1, the insulating member 50 is provided between the thermally and electrically conductive sheet 10 and the electrically conductive cooling member 40 so that the insulating member 50 faces the semiconductor element 30 through the opening 21 of the electrically conductive shielding can 20. Further, in the semiconductor device 1, the electrically conductive shielding can 20 and the electrically conductive cooling member 40 are electrically connected to each other via the thermally and electrically conductive sheet 10. As a result, in the semiconductor device 1, the static electricity S discharged to the electrically conductive cooling member 40 flows through the thermally and electrically conductive sheet 10 while avoiding the insulating member 50, and can flow to the ground 32 through the electrically conductive shielding can 20. Therefore, the semiconductor device 1 can prevent the static electricity discharged to the electrically conductive cooling member 40 from being transmitted to electronic components such as the semiconductor element 30, and can prevent malfunction and damage.

Here, the state in which the semiconductor element 30 and the insulating member 50 face each other through the opening 21 includes a case where the insulating member 50 faces the entire region of the semiconductor element 30 exposed to the side of the electrically conductive cooling member 40 from the opening 21, and other cases where the insulating member 50 is overlapped with a part of the semiconductor element 30 exposed to the electrically conductive cooling member 40 side from the opening 21 as long as the effect of protection against electro-static discharge (ESD) is achieved.

Next, each member constituting the semiconductor device 1 will be described.

Semiconductor Device

As shown in FIG. 1, the semiconductor device 1 includes the semiconductor element 30 formed on a substrate 31. The semiconductor element 30 is not particularly limited as long as it is an electronic component made of a semiconductor. Examples include integrated circuits such as ICs and LSIs, CPUs, MPUs, graphic processing elements, and image sensors, among others.

Also, the substrate 31 on which the semiconductor element 30 is formed is not particularly limited, and an appropriate substrate can be used according to the type of the semiconductor device. The substrate 31 is provided with the ground (GND) 32. The ground 32 may be formed on the inner layer of the substrate 31 or on the back surface of the substrate 31 as shown in FIG. 1.

Figure 2:
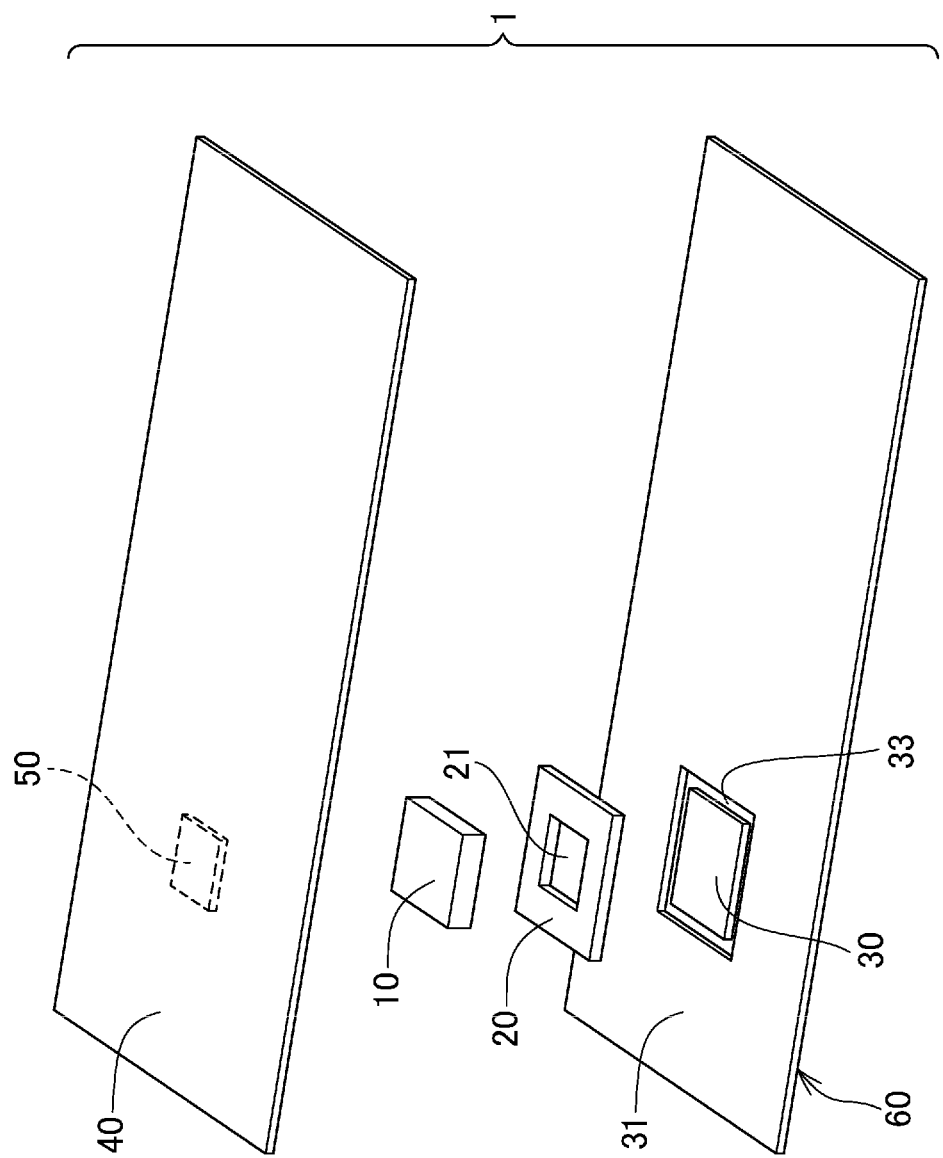
FIG. 2 is an exploded perspective view of the semiconductor device shown in FIG. 1.

In FIG. 1, for convenience of illustration, the electrically conductive shielding can 20 is shown penetrating the substrate 31 and directly connecting to the ground 32. However, in a general practical use, as shown in FIG. 2, a land 33 is provided on the surface of the substrate 31 so as to surround the semiconductor element 30 in the whole or in part, and the electrically conductive shielding can 20 is connected to this part by solder or the like. The land 33 is electrically connected to the ground 32 by a through hole (not shown) formed in the substrate 31, whereby the electrically conductive shielding can 20 is electrically connected to the ground 32.

The substrate 31 is provided with a microstrip line 35 at a position where the semiconductor element 30 is mounted.

Shielding Can

As shown in FIG. 1, the semiconductor device 1 includes the opening 21 through which at least a part of the semiconductor element 30 is exposed to the side of the electrically conductive cooling member 40, and the electrically conductive shielding can 20 connected to the ground 32. In the semiconductor device 1, the electrically conductive shielding can 20 connected to the ground 32 shields the semiconductor element 30 together with the thermally and electrically conductive sheet 10 and the electrically conductive cooling member 40, thereby shielding electromagnetic waves and exhibiting an electromagnetic wave suppressing effect. As will be described later, the semiconductor device 1 can efficiently dissipate heat of the semiconductor element 30 to the electrically conductive cooling member 40 by thermally connecting the semiconductor element 30 exposed from the opening 21 and the electrically conductive cooling member 40 through the thermally and electrically conductive sheet 10.

The material constituting the electrically conductive shielding can 20 is not particularly limited as long as it has a high electrical conductivity and a high shielding effect of electromagnetic waves. For example, a metal having a high electrical conductivity such as aluminum, copper, stainless steel, or a magnetic material having a high electrical conductivity can be used. Examples of the magnetic material having high electrical conductivity include permalloy, Sendust, Fe or Co amorphous materials, and microcrystalline materials. When the above-mentioned magnetic material is used as the material constituting the shielding can 20, the magnetic shielding effect and the magnetic absorption effect can be expected in addition to the electric shielding effect.

The opening 21 provided in the electrically conductive shielding can 20 is a through hole provided in the electrically conductive shielding can 20. In the electrically conductive shielding can 20, the semiconductor element 30 faces the insulating member 50 and the electrically conductive cooling member 40 through the opening 21, and the thermally and electrically conductive sheet 10, which will be described later, is provided between the semiconductor element 30 and the cooling member 40. That is, as shown in FIG. 1, the thermally and electrically conductive sheet 10 is formed in a direction connecting the semiconductor element 30 and the electrically conductive cooling member 40 (in FIG. 1, the stacking direction of each member).

The size of the opening 21 is not particularly limited, and can be appropriately changed according to the size of the semiconductor element 30 or other factors. The smaller the opening area of the opening 21, the smaller the emission of electromagnetic waves and the smaller the radiation electromagnetic field. However, from the viewpoint of releasing heat from the semiconductor element 30, it is preferable to use a large thermally and electrically conductive sheet 10 with the opening 21 enlarged. Therefore, the size of the opening 21 is appropriately adjusted according to the thermal conductivity and the electromagnetic noise suppression effect required for the semiconductor device 1.

Electrically Conductive Cooling Member

As shown in FIG. 1, the electrically conductive cooling member 40 of the semiconductor device 1 is provided on an upper portion of the electrically conductive shielding can 20. The electrically conductive cooling member 40 is a member for absorbing heat generated by the semiconductor element 30 acting as a heat source and dissipating the heat to the outside. The electrically conductive cooling member 40 is connected to the semiconductor element 30 via the thermally and electrically conductive sheet 10, which will be described later, so that heat generated by the semiconductor element 30 can be diffused to the outside, thereby ensuring heat dissipation of the semiconductor device 1.

The type of the electrically conductive cooling member 40 is not particularly limited, and can be appropriately selected according to the type of the semiconductor device 1. Examples include a radiator, a cooler, a heat sink, a heat spreader, a die pad, a cooling fan, a heat pipe, a metal cover, and an electronic device housing. Among these heat dissipating members, a radiator, a cooler, or a heat sink is preferably used in view of achieving more excellent heat dissipating properties.

It should be noted that, as shown in FIG. 1, the electrically conductive cooling member 40 is provided at an upper portion of the electrically conductive shielding can 20, but is not in contact with the electrically conductive shielding can 20 and is provided at a certain distance. This is because the thermally and electrically conductive sheet 10, which will be described later, is provided between a top surface 20a of the electrically conductive shielding can 20 and the electrically conductive cooling member 40, and electrically connects the electrically conductive shielding can 20 and the electrically conductive cooling member 40 through the thermally and electrically conductive sheet 10.

Thermally and Electrically Conductive Sheet

As shown in FIG. 1, the semiconductor device 1 includes the thermally and electrically conductive sheet 10 which is sandwiched between the electrically conductive shielding can 20 and the electrically conductive cooling member 40 and is in contact with the semiconductor element 30 and the electrically conductive cooling member 40. In the semiconductor device 1, the electrically conductive shielding can 20 and the electrically conductive cooling member 40 are electrically connected to each other via the thermally and electrically conductive sheet 10, and the semiconductor element 30 and the electrically conductive cooling member 40 are thermally connected to each other via the thermally and electrically conductive sheet 10.

Since the thermally and electrically conductive sheet 10 having electrical conductivity and high thermal conductivity is provided between the semiconductor element 30 and the electrically conductive cooling member 40, heat of the semiconductor element 30 can be transmitted to the electrically conductive cooling member 40 through the thermally and electrically conductive sheet 10 to improve heat dissipation. In addition, since the electrically conductive shielding can 20 and the electrically conductive cooling member 40 are electrically connected to each other through the thermally and electrically conductive sheet 10, static electricity discharged to the electrically conductive cooling member 40 can flow to the electrically conductive shielding can 20 connected to the ground 32.

The thermally and electrically conductive sheet 10 preferably has flexibility and tackiness. The flexibility facilitates handling and improves adhesiveness to the semiconductor element 30, the electrically conductive shielding can 20, and the electrically conductive cooling member 40, thereby achieving excellent thermal conductivity and electrical conductivity. Further, the flexibility enables pressurization by the electrically conductive cooling member 40, thereby ensuring more adhesiveness, and maintaining adhesiveness even when expansion or contraction occurs.

The material constituting the thermally and electrically conductive sheet 10 is not particularly limited as long as it has excellent electrical conductivity and thermal conductivity. For example, in view of the high level of electrical conductivity and thermal conductivity, a thermally conductive sheet including a binder resin, a thermally conductive filler, and an electrically conductive filler can be used as the thermally and electrically conductive sheet 10. The material constituting the thermally and electrically conductive sheet 10 will be described below.

Binder Resin

The binder resin constituting the thermally and electrically conductive sheet 10 is a resin component to be a base material of the thermally and electrically conductive sheet 10. The type is not particularly limited, and a known binder resin can be appropriately selected. For example, one of the binder resins is a thermosetting resin.

Examples of the thermosetting resin include crosslinkable rubber, epoxy resin, polyimide resin, bismaleimide resin, benzocyclobutene resin, phenol resin, unsaturated polyester, diallyl phthalate resin, silicone, polyurethane, polyimide silicone, thermosetting polyphenylene ether, and thermosetting modified polyphenylene ether, among others. These may be used alone or in combination of two or more.

Examples of the crosslinkable rubber include natural rubber, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber, among others. These may be used alone or in combination of two or more.

Among the above-mentioned thermosetting resins, silicone is preferably used in view of excellent molding processability and weather resistance, as well as adhesiveness and followability to electronic components. The silicone is not particularly limited, and the type of silicone can be appropriately selected according to the purpose.

From the viewpoint of obtaining the molding processability, weather resistance, and adhesiveness, among others, it is preferable that the silicone is composed of a main agent of a liquid silicone gel and a curing agent. Such silicones include, for example, addition reaction type liquid silicones and thermal vulcanization type millable silicones using peroxides for vulcanization.

A preferable example of the addition reaction type liquid silicones is a two-part addition reaction type silicone containing a polyorganosiloxane having a vinyl group as a main agent and a polyorganosiloxane having a Si—H group as a curing agent. In the combination of the main agent of the liquid silicone gel and the curing agent, the blending ratio of the main agent and the curing agent is preferably 35:65 to 65:35 by mass ratio.

The content of the binder resin in the thermally and electrically conductive sheet 10 is not particularly limited, and can be appropriately selected according to the purpose. For example, from the viewpoint of ensuring the formability of the sheet and the adhesiveness of the sheet, it is preferably about 20 to 50 vol %, more preferably about 30 to 40 vol %, of the thermally and electrically conductive sheet 10.

Thermally Conductive Filler

The thermally and electrically conductive sheet 10 contains a thermally conductive filler in a binder resin. The thermally conductive filler is a component for improving the thermal conductivity of the sheet. The type of the thermally conductive filler is not particularly limited, but it is preferable to use a fibrous thermally conductive filler in view of achieving higher thermal conductivity.

The "fibrous" of the fibrous thermally conductive filler refers to a shape having a high aspect ratio (approximately 6 or more). Therefore, in the present invention, not only thermally conductive fillers such as fibrous and rod-like fillers but also granular fillers and flake-like thermally conductive fillers having a high aspect ratio are included in the fibrous thermally conductive fillers.

The type of the fibrous thermally conductive filler is not particularly limited as long as it is a fibrous material having high thermal conductivity, and examples thereof include metals such as silver, copper, and aluminum, ceramics such as alumina, aluminum nitride, silicon carbide, and graphite, and carbon fibers, among others. Among these fibrous thermally conductive fillers, it is preferable to use carbon fibers in view of achieving higher thermal conductivity.

The thermally conductive filler may be used alone or in combination by mixing two or more fillers. When two or more types of thermally conductive fillers are used, all of them may be fibrous thermally conductive fillers, or a fibrous thermally conductive filler may be mixed with a thermally conductive filler of different shapes.

The type of the carbon fiber is not particularly limited, and can be appropriately selected according to the purpose. For example, a material obtained by graphitizing pitch-based fiber, PAN-based fiber, and PBO fiber, or a material synthesized by arc discharge method, laser evaporation method, CVD (chemical vapor deposition) method, or CCVD (catalytic chemical vapor deposition) method, among others, can be used. Among them, carbon fibers obtained by graphitizing PBO fibers and pitch-based carbon fibers are more preferable from the viewpoint of obtaining high thermal conductivity.

The carbon fiber may be processed by surface treatment of a part or the whole of the carbon fiber as required.

Examples of the surface treatment include an oxidation treatment, a nitriding treatment, a nitration treatment, a sulfonation treatment, and a treatment for attaching or bonding a metal, a metal compound, an organic compound to the functional group introduced to the surface by these treatments or the surface of the carbon fiber. Examples of the functional group include a hydroxyl group, a carboxyl group, a carbonyl group, a nitro group, and an amino group.

Further, the average fiber length (average long axis length) of the fibrous thermally conductive filler can be appropriately selected without any particular limitation, and from the viewpoint of reliably obtaining high thermal conductivity, it is preferably in the range of 50 to 300 µm, more preferably in the range of 75 to 275 µm, and particularly preferably in the range of 90 to 250 µm. Further, the average fiber diameter (average short axis length) of the fibrous thermally conductive filler can be appropriately selected without any particular limitation, and from the viewpoint of reliably obtaining high thermal conductivity, it is preferably in the range of 4 to 20 µm, and more preferably in the range of 5 to 14 µm.

The aspect ratio (average long axis length/average short axis length) of the fibrous thermally conductive filler is 6 or more and preferably 7 to 30 from the viewpoint of reliably obtaining high thermal conductivity. Even when the aspect ratio is small, an improvement effect of thermal conductivity or the like is observed, but since a large characteristic improvement effect cannot be obtained, for example, due to a decrease in orientation, the aspect ratio is preferably set to 6 or more. On the other hand, when the value exceeds 30, the dispersibility in the thermally and electrically conductive sheet 10 decreases, so that the thermal conductivity might be insufficient.

Here, the average long axis length and the average short axis length of the fibrous thermally conductive filler can be measured by, for example, a microscope, a scanning electron microscope (SEM) or the like, and the average can be calculated from a plurality of samples.

The content of the fibrous thermally conductive filler in the thermally and electrically conductive sheet 10 is not particularly limited and can be appropriately selected according to the purpose, but is preferably from 4 to 40 vol %, more preferably from 5 to 30 vol %, and particularly preferably from 6 to 20 vol %. If the content is less than 4 vol %, it may be difficult to obtain a sufficiently low thermal resistance, and if the content is more than 40 vol %, it may affect the formability of the thermally and electrically conductive sheet 10 and the orientation of the fibrous thermally conductive filler.

Further, in the thermally and electrically conductive sheet 10, the thermally conductive filler is preferably oriented in one or more directions. By orienting the thermally conductive filler, higher thermal conductivity and electromagnetic wave absorption can be realized.

For example, when it is desired to improve the thermal conductivity of the thermally and electrically conductive sheet 10 and the heat dissipation of the semiconductor device, the thermally conductive filler can be oriented substantially perpendicular to the sheet surface. On the contrary, when it is desired to improve the electromagnetic wave shielding performance of the thermally and electrically conductive sheet 10 and improve the electromagnetic wave suppressing effect of the semiconductor device, the thermally conductive filler can be oriented substantially parallel to the sheet surface.

Here, a direction substantially perpendicular to or substantially parallel to the sheet surface means a direction substantially perpendicular to or substantially parallel to the sheet surface direction. However, since the orientation direction of the thermally conductive filler varies slightly during manufacturing, the present invention allows a deviation of about ±20° from the direction perpendicular to or parallel to the sheet surface.

The method of adjusting the orientation angle of the thermally conductive filler is not particularly limited. For example, the orientation angle can be adjusted by preparing a molded body for a sheet which is a base of the thermally and electrically conductive sheet 10 and adjusting the cutting angle in a state where the fibrous thermally conductive filler is oriented.

Electrically Conductive Filler

The thermally and electrically conductive sheet 10 contains an electrically conductive filler in a binder resin. The electrically conductive filler is a component for improving the conductivity of the sheet. The type of the electrically conductive filler is not particularly limited, but it is preferable to use a fibrous electrically conductive filler in view of achieving higher conductivity and having conductive anisotropy easily conducting in the thickness direction of the sheet and hardly conducting in the surface direction of the sheet.

This type of electrically conductive filler can be made of a material having electrical conductivity among the above-described thermally conductive fillers. Among them, the carbon fiber can be suitably used because it has high thermal conductivity and electrical conductivity.

By orienting the fibrous electrically conductive filler substantially perpendicular to the sheet surface, the thermally and electrically conductive sheet 10 is preferably provided with a conductive anisotropy which is easily conductive in the thickness direction of the sheet and hardly conductive in the surface direction of the sheet. The thermally and electrically conductive sheet 10 is sandwiched between the electrically conductive shielding can 20 and the electrically conductive cooling member 40, whereby the static electricity discharged to the electrically conductive cooling member 40 is allowed to flow to the electrically conductive shielding can 20, and the static electricity which flows into the thermally and electrically conductive sheet 10 while avoiding the insulating member 50 to be described later basically flows to the electrically conductive shielding can 20 having a relatively low electric resistance, and by providing the conductive anisotropy, the static electricity hardly flows under the insulating member 50 and can be prevented from being transmitted to the semiconductor element 30 more reliably. The electric resistance ratio of the thermally and electrically conductive sheet 10 in the in-plane direction with respect to the thickness direction is preferably high and for example, 100 times or more.

Inorganic Filler

The thermally and electrically conductive sheet 10 may further contain an inorganic filler in addition to the binder resin, the thermally conductive filler, and the electrically conductive filler described above. This is because the thermal conductivity of the thermally and electrically conductive sheet 10 can be further enhanced to improve the strength of the sheet.

The inorganic filler is not particularly limited in terms of shape, material, and average particle diameter, and can be appropriately selected according to the purpose. Examples of the shape include spherical, elliptical, massive, granular, flat, and needle-like shapes. Among them, the spherical shape and the elliptical shape are preferable from the viewpoint of the fillability, and the spherical shape is particularly preferable.

Examples of the material of the inorganic filler include aluminum nitride (AlN), silica, alumina (aluminium oxide), boron nitride, titania, glass, zinc oxide, silicon carbide, silicon, silicon oxide, and metal particles, among others. One or more of these may be used alone or in combination. Among them, alumina, boron nitride, aluminum nitride, zinc oxide, and silica are preferable, and alumina and aluminum nitride are particularly preferable from the viewpoint of thermal conductivity.

The inorganic filler may be surface treated. When the inorganic filler is treated with a coupling agent as the surface treatment, the dispersibility of the inorganic filler is improved and the flexibility of the thermally and electrically conductive sheet 10 is improved.

The average particle diameter of the inorganic filler can be appropriately selected according to the type of inorganic substance or the like. When the inorganic filler is alumina, the average particle diameter thereof is preferably from 1 to 10 μm, more preferably from 1 to 5 μm, and particularly preferably from 4 to 5 μm. If the average particle diameter is less than 1 μm, the viscosity may be increased and the mixing may become difficult. On the other hand, when the average particle diameter exceeds 10 μm, there is a possibility that the thermal resistance of the thermally and electrically conductive sheet 10 increases.

When the inorganic filler is aluminum nitride, the average particle diameter thereof is preferably 0.3 to 6.0 μm, more preferably 0.3 to 2.0 μm, and particularly preferably 0.5 to 1.5 μm. If the average particle diameter is less than 0.3 μm, the viscosity may be increased and the mixing may become difficult, and if the average particle diameter exceeds 6.0 μm, the thermal resistance of the thermally and electrically conductive sheet 10 may be increased.

The average particle size of the inorganic filler can be measured by, for example, a particle size distribution meter or a scanning electron microscope (SEM).

Magnetic Metal Powder

Further, the thermally and electrically conductive sheet 10 preferably further contains magnetic metal powder in addition to the binder resin, fibrous thermally conductive fibers, and inorganic filler described above. By including the magnetic metal powder, electromagnetic wave absorbency can be imparted to the thermally and electrically conductive sheet 10.

The type of the magnetic metal powder is not particularly limited as long as it has electromagnetic wave absorbability, and a known magnetic metal powder can be appropriately selected. For example, amorphous metal powder or crystalline metal powder can be used. Examples of the amorphous metal powder include Fe—Si—B—Cr type, Fe—Si—B type, Co—Si—B type, Co—Zr type, Co—Nb type, and Co—Ta type, and examples of the crystalline metal powder include pure iron, Fe type, Co type, Ni type, Fe—Ni type, Fe—Co type, Fe—Al type, Fe—Si type, Fe—Si—Al type, and Fe—Ni—Si—Al type. Further, as the crystalline metal powder, refined microcrystalline metal powder obtained by adding a small amount of N (nitrogen), C (carbon), O (oxygen), B (boron) or the like to the crystalline metal powder may be used.

The magnetic metal powder may be a mixture of two or more different materials or different average particle sizes.

The shape of the magnetic metal powder is preferably adjusted to be spherical, flat, or the like. For example, in the case of increasing the fillability, it is preferable to use a magnetic metal powder having a spherical particle diameter of several μm to several tens μm. Such a magnetic metal powder can be produced by, for example, an atomizing method or a method for thermally decomposing a metal carbonyl. The atomizing method has an advantage that a spherical powder can be easily formed, and is a method in which a molten metal is made to flow out from a nozzle, and a jet stream of air, water, an inert gas, or the like is blown onto the molten metal which has flowed out to solidify the molten metal as droplets. When the amorphous magnetic metal powder is produced by the atomizing method, the cooling rate is preferably set to about $1 \times 10^6$ (K/s) in order to prevent the molten metal from crystallizing.

When the amorphous alloy powder is produced by the atomizing method described above, the surface of the amorphous alloy powder can be made smooth. By using the amorphous alloy powder having a small surface unevenness and a small specific surface area as the magnetic metal powder, the fillability with respect to the binder resin can be enhanced. Further, by performing the coupling treatment, the fillability can be further improved.

In addition to the binder resin, the thermally conductive filler, the electrically conductive filler, the inorganic filler, and the magnetic metal powder described above, the thermally and electrically conductive sheet 10 may optionally contain other components according to the purpose. Other components include, for example, thixotropy-imparting agents, dispersants, curing accelerators, retarders, slight tackifiers, plasticizers, flame retardants, antioxidants, stabilizers, and colorants, among others.

Figure 3:
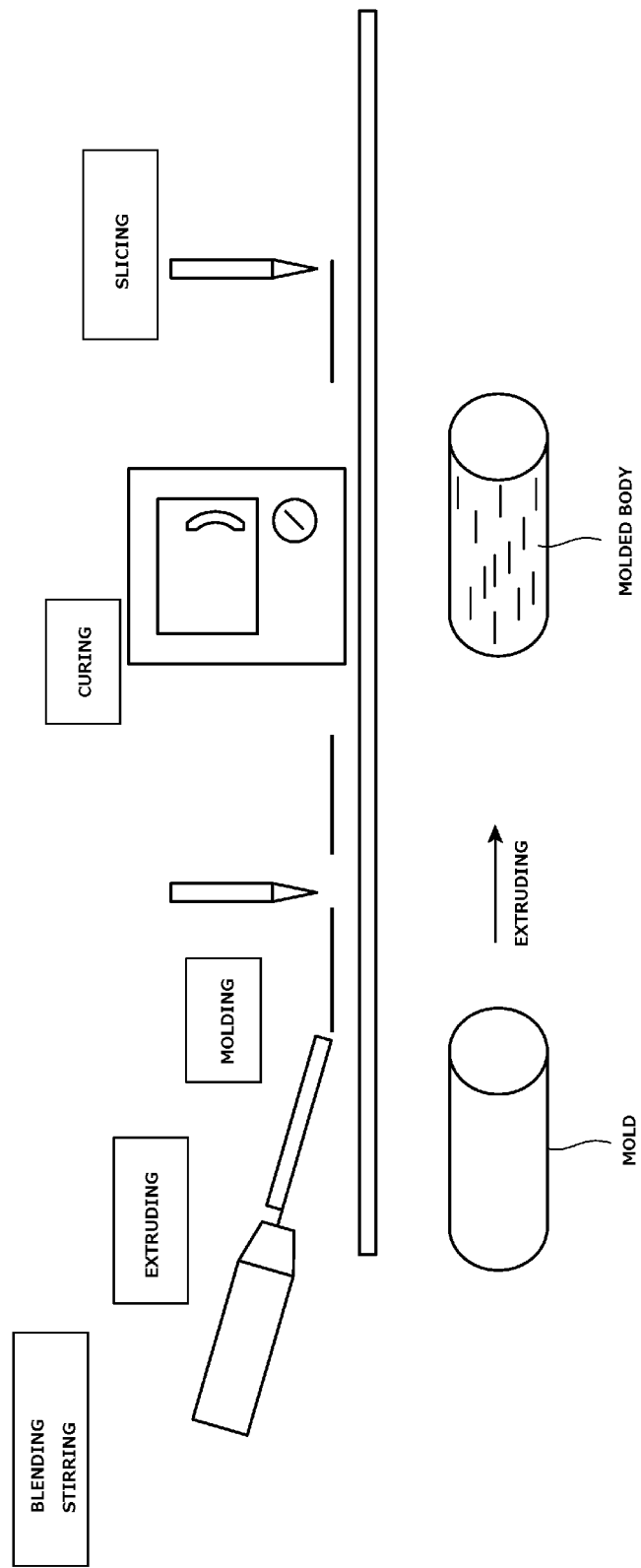
FIG. 3 is a view illustrating a manufacturing process of a thermally and electrically conductive sheet.

FIG. 3 is a schematic view illustrating an example of a manufacturing process of the thermally and electrically conductive sheet 10. As shown in FIG. 3, the thermally and electrically conductive sheet 10 is manufactured through a series of steps such as extrusion, molding, curing, and cutting (slicing). First, a binder resin, a filler, an inorganic filler, and a magnetic metal powder are mixed and stirred to prepare a thermally conductive resin composition. Next, the prepared thermally conductive resin composition is extruded into a predetermined shape such as a rectangular parallelepiped and cured to obtain a molded body of the thermally conductive resin composition. When the prepared thermally conductive resin composition is extruded, the filler such as carbon fiber blended in the thermally conductive resin composition can be oriented in the extrusion direction by passing through a plurality of slits. Next, after the obtained molded body is cured, the cured molded body is cut to a predetermined thickness by an ultrasonic cutter in a direction perpendicular to the extrusion direction, thereby producing the thermally and electrically conductive sheet 10. Because the filler such as carbon fiber is oriented in the thickness direction, the thermally and electrically conductive sheet 10 has thermal and electrical anisotropy in which thermal and electrical conductivity in the thickness direction is high and thermal and electrical conductivity in the surface direction is low.

The size of the thermally and electrically conductive sheet 10 is not particularly limited, but it is provided between the semiconductor element 30 and the cooling member 40 facing each other through the opening 21 of the shielding can 20, electrically connects the electrically conductive shielding can 20 and the electrically conductive cooling member 40, and therefore has a covering area at least larger than the area of the opening 21 as shown in FIG. 1. Although the upper limit of the covering area of the thermally and electrically conductive sheet 10 is not particularly limited, since it is provided on the top surface 20a of the electrically conductive shielding can 20, the area of the top surface 20a of the electrically conductive shielding can 20 is substantially the upper limit.

Figure 4:
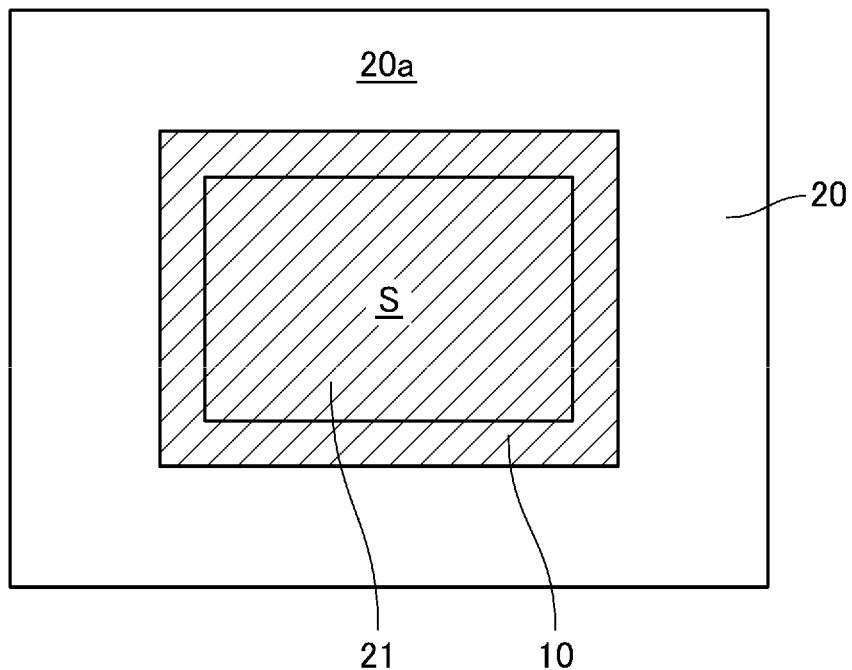
FIG. 4 schematically illustrates a state of the top surface of the electrically conductive shielding can and the thermally and electrically conductive sheet.

Here, FIG. 4 is a view illustrating a state where the thermally and electrically conductive sheet 10 and the electrically conductive shielding can 20 are viewed from above. As shown in FIG. 4, the covering area of the thermally and electrically conductive sheet 10 is the area of the electrically conductive shielding can 20 (including the opening 21) covered by the thermally and electrically conductive sheet 10 (area S of the shaded portion in FIG. 4).

As shown in FIG. 4, the thermally and electrically conductive sheet 10 is provided on the top surface 20a including the opening 21 of the electrically conductive shielding can 20. The thermally and electrically conductive sheet 10 may cover the top surface 20a including the opening 21 and the back surface 20b of the electrically conductive shielding can 20. The top surface 20a of the electrically conductive shielding can 20 refers to the surface of the electrically conductive shielding can 20 on the side of the electrically conductive cooling member 40, and the back surface 20b of the electrically conductive shielding can 20 refers to a surface of the electrically conductive shielding can 20 on the side of the semiconductor element 30. When the thermally and electrically conductive sheet 10 covers both the top surface 20a and the back surface 20b of the electrically conductive shielding can 20, the covering area is not the sum of the covering areas on the top surface 20a and the back surface 20b, but the covering area on each surface. This is because the thermally and electrically conductive sheet 10 can achieve superior heat dissipation properties by covering a part of the top surface 20a and a part of the back surface 20b of the electrically conductive shielding can 20.

The thermally and electrically conductive sheet 10 can be constituted by laminating and integrating a plurality of sheets. For example, as shown in FIG. 1, when the thermally and electrically conductive sheet 10 is provided between the semiconductor element 30 and the cooling member 40 facing each other through the opening 21 of the electrically conductive shielding can 20 and covers the top surface 20a of the electrically conductive shielding can 20 (that is, when the covering area of the thermally and electrically conductive sheet 10 is larger than the area of the opening 21 of the shielding can 20), the thermally and electrically conductive sheet 10 is preferably formed of a plurality of sheets having different sizes. By combining sheets of different sizes, the thermally and electrically conductive sheet 10 can have a desired shape. As shown in FIG. 1, for example, the thermally and electrically conductive sheet 10 can be formed with a projection 10a that enters the opening 21 and contacts with the semiconductor element 30, and a body portion 10b that contacts with the top surface 20a of the electrically conductive shielding can 20 and the electrically conductive cooling member 40.

The thermally and electrically conductive sheet 10 may be composed of one sheet. In this case, the thermally and electrically conductive sheet 10 is sandwiched between the semiconductor element 30 and the electrically conductive cooling member 40 and pressed to cover a part of the top surface 20a of the shielding can 20, and the part of the sheet is pushed out into the electrically conductive shielding can 20 through the opening 21 to be brought into contact with the semiconductor element 30.

However, when the thermally and electrically conductive sheet 10 is formed of a plurality of sheets having different sizes, no step such as pressing is required, so that the thermally and electrically conductive sheet 10 can be formed in a state in which a fibrous thermally conductive filler described later is oriented, and as a result, superior heat dissipation can be achieved.

The thickness of the thermally and electrically conductive sheet 10 is not particularly limited, and can be appropriately changed according to the distance between the semiconductor element 30 and the electrically conductive cooling member 40, the size of the shielding can 20, and the like. However, in view of the fact that heat dissipation, electromagnetic wave suppression effect, and conductivity between the electrically conductive cooling member 40 and the electrically conductive shielding can 20 can be realized at a higher level, the thickness of the thermally and electrically conductive sheet 10 is preferably from 50 µm to 4 mm, more preferably from 100 µm to 4 mm, and particularly preferably from 200 µm to 3 mm, If the thickness of the thermally and electrically conductive sheet 10 exceeds 4 mm, the distance between the semiconductor element 30 and the electrically conductive cooling member 40 becomes longer, and thus the heat transfer characteristic may be degraded, whereas if the thickness of the thermally and electrically conductive sheet 10 is less than 50 µm, the electromagnetic wave suppressing effect may be reduced.

Here, the thickness of the thermally and electrically conductive sheet 10 means the thickness of the thickest portion of the thermally and electrically conductive sheet 10, as shown in FIG. 1, regardless of whether the thermally and electrically conductive sheet 10 is formed of one sheet or a plurality of sheets.

The thermally and electrically conductive sheet 10 preferably has tackiness on the surface. This is because the adhesion between the thermally and electrically conductive sheet 10 and other members can be improved, and the sheet can be prevented from being deviated from the initially disposed position of the sheet on the electrically conductive shielding can 20 or the semiconductor element 30. Further, in the case where the thermally and electrically conductive sheet 10 is composed of a plurality of sheets, the adhesion between the sheets can also be improved. The method of imparting tackiness to the surface of the thermally and electrically conductive sheet 10 is not particularly limited. For example, the binder resin constituting the thermally and electrically conductive sheet 10 may be optimized to provide tackiness, or an adhesive layer having tackiness may be separately provided on the surface of the thermally and electrically conductive sheet 10.

Further, the thermal conductivity of the portion in contact with the semiconductor element 30 can be enhanced by making the thermal conductivity of the central portion of the thermally and electrically conductive sheet 10 to be larger than the thermal conductivity of the outer peripheral portion of the sheet. On the other hand, with respect to the outer periphery of the sheet having a small area in contact with the semiconductor element 30, electromagnetic wave absorption performance can be prioritized over thermal conductivity. As a result, the semiconductor device 1 can achieve more excellent heat dissipation properties and electromagnetic wave suppression effects.

Here, the sheet center portion of the thermally and electrically conductive sheet 10 refers to a portion where the thermally and electrically conductive sheet 10 contacts the semiconductor element 30, and particularly a portion corresponding to a portion having a large amount of heat generation (a portion commonly referred to as a hot spot). The outer peripheral portion of the sheet refers to a portion other than the center portion.

The method of changing the thermal conductivity of the thermally and electrically conductive sheet 10 is not particularly limited, but it is possible to change the thermal conductivity by changing the material, the blending ratio, and the orientation direction, among others, of the fibrous thermally conductive filler in the central portion of the sheet and the outer peripheral portion of the sheet.

Insulating Member

The insulating member 50 is provided between the semiconductor element 30 exposed on the electrically conductive cooling member 40 side from the opening 21 of the electrically conductive shielding can 20 and the electrically conductive cooling member 40, and faces the semiconductor element 30 through the opening 21. Thus, the insulating member 50 prevents the static electricity discharged to the electrically conductive cooling member 40 from flowing into the semiconductor element 30.

The insulating member 50 is not particularly limited as long as it is made of a material having an electric resistance higher than that of the thermally and electrically conductive sheet 10, and can be made of any known material. Since the insulating member 50 is provided between the semiconductor element 30 and the electrically conductive cooling member 40, it is preferable to be formed of a material having excellent thermal conductivity from the viewpoint of efficiently transferring heat of the semiconductor element 30 to the electrically conductive cooling member 40 in addition to high electrical resistivity. Examples of such a material having high thermal conductivity and high electrical resistivity include thermally conductive ceramics such as aluminum nitride (AlN).

The insulating member 50 is provided on one surface 40*a* of the electrically conductive cooling member 40 facing the semiconductor element 30 by adhesion or the like. Here, as shown in FIG. 1, it is preferable that the insulating member 50 has an area smaller than the area of the thermally and electrically conductive sheet 10 and is entirely covered with the thermally and electrically conductive sheet 10 provided on the one surface 40*a*. As described above, in the semiconductor device 1, the thermally and electrically conductive sheet 10 covers the insulating member 50 facing the semiconductor element 30 through the opening 21, so that the electrically conductive shielding can 20 and the electrically conductive cooling member 40 are electrically connected to each other through the thermally and electrically conductive sheet 10 around the opening 21 on the top surface 20*a* of the electrically conductive shielding can 20.

As a result, the static electricity discharged to the electrically conductive cooling member 40 of the semiconductor device 1 is guided to the outer edge portion of the thermally and electrically conductive sheet 10 covering the insulating member 50 by the insulating member 50, and flows to the ground 32 through the top surface 20*a* of the electrically conductive shielding can 20 provided around the opening 21 connected to the outer edge portion of the thermally and electrically conductive sheet 10. Since the electrically conductive shielding can 20 has a low electrical resistance and is connected to the ground 32, static electricity flowing to the outer edge portion of the thermally and electrically conductive sheet 10 can be forcedly guided to the electrically conductive shielding can 20 and the ground 32. Thus, by overlapping the semiconductor element 30 with the insulating member 50, static electricity can be avoided from the semiconductor element 30 and can be guided to the top surface 20*a* around the opening 21 of the electrically conductive shielding can 20 having a high conductivity, so that it is possible to prevent static electricity from being transmitted to the semiconductor element 30 and to prevent malfunction and damage from occurring.

Further, by providing the thermally and electrically conductive sheet 10 with an electrical anisotropy in which electricity easily flows in the thickness direction, in this case, in the direction extending between the electrically conductive cooling member 40 and the top surface 20*a* of the electrically conductive shielding can 20, and hardly flows in the surface direction, in this case, in the direction crossing the top surface 20*a* of the electrically conductive shielding can 20 and the opening 21, static electricity is hardly transmitted from the outer edge of the thermally and electrically conductive sheet 10 to the side of the semiconductor element 30, and malfunction and damage can be further prevented.

In the semiconductor device 1 shown in FIG. 1, the opening 21 is formed smaller than the size of the semiconductor element 30, and a part of the semiconductor element 30 faces the insulating member 50 through the opening 21.

As shown in FIG. 1, it is preferable that the insulating member 50 has an area equal to or larger than the area of the opening 21, and is overlapped with the entire area of the semiconductor element 30 facing the insulating member through the opening 21. Since static electricity hardly flows in the region overlapped with the insulating member 50, the insulating member 50 has an area equal to or larger than the area of the opening 21 and is overlapped with the entire region of the semiconductor element 30 exposed from the opening 21 to the side of the electrically conductive cooling member 40, whereby the static electricity hardly flows into the semiconductor element 30.

Manufacturing Process of the Semiconductor Device 1

The semiconductor device 1 can be formed by mounting the semiconductor element 30 on the substrate 31 on which the microstrip line 35 and the ground 32 are formed, arranging the electrically conductive shielding can 20, the thermally and electrically conductive sheet 10, and the electrically conductive cooling member 40 in this order, and then pressurizing the electrically conductive cooling member 40.

The electrically conductive cooling member 40 is previously provided with the insulating member 50 at a predetermined position facing the opening 21 of the electrically conductive shielding can 20. Therefore, by arranging the electrically conductive cooling member 40 on the substrate 31, the insulating member 50 is provided between the semiconductor element 30 and the electrically conductive cooling member 40 and faces the semiconductor element 30 through the opening 21.

As described above, the electrically conductive shielding can 20 is connected by solder or the like to the land 33 provided on the entire circumference or partially so as to surround the semiconductor element 30. The land 33 is electrically connected to the ground 32 by a through hole (not shown) formed in the substrate 31, whereby the electrically conductive shielding can 20 is electrically connected to the ground 32.

The thermally and electrically conductive sheet 10 is sandwiched between the electrically conductive cooling member 40 and the top surface 20*a* of the electrically conductive shielding can 20 by pressurizing the electrically conductive cooling member 40. As a result, the electrically conductive shielding can 20 connected to the ground 32 is electrically connected to the electrically conductive cooling member 40 via the thermally and electrically conductive sheet 10.

Modified Embodiment 1

Figure 5:
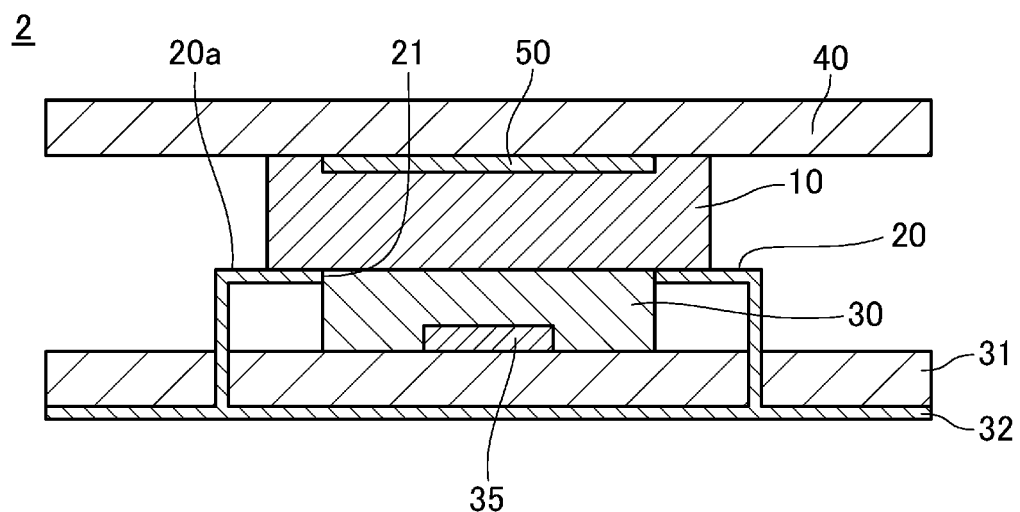
FIG. 5 is a cross-sectional view of another semiconductor device shown as an example of an electronic device according to the present technology.

Next, a modified embodiment of the semiconductor device according to the present technology will be described. In the following description, the same members as those of the semiconductor device 1 are denoted by the same reference numerals, and their details are omitted. As shown in FIG. 5, in a semiconductor device 2 according to the present technology, the opening 21 may be formed larger than the semiconductor element 30, and the entire semiconductor element 30 may face the electrically conductive cooling member 40. In the semiconductor device 2 shown in FIG. 5, it is preferable that the insulating member 50 has an area equal to or larger than the area of the semiconductor element 30 and is overlapped with the entire area of the semiconductor element 30 facing via the opening 21. Thus, in the semiconductor device 2 as well, since the insulating member 50 is overlapped with the entire region of the semiconductor element 30, it is possible to make it more difficult for static electricity to flow through the semiconductor element 30.

Further, in the semiconductor device 2, since the opening 21 of the electrically conductive shielding can 20 is formed to be larger than the semiconductor element 30, the top surface 20a of the electrically conductive shielding can 20 can be flush with the semiconductor element 30, and the height of the electrically conductive shielding can 20 can be suppressed to be equal to the height of the semiconductor element 30 while maintaining the electromagnetic wave suppression effect. Further, the thermally and electrically conductive sheet 10 does not need to enter the opening 21, and the height of the semiconductor device 2 can be reduced as a whole.

Modified Embodiment 2

Figure 6:
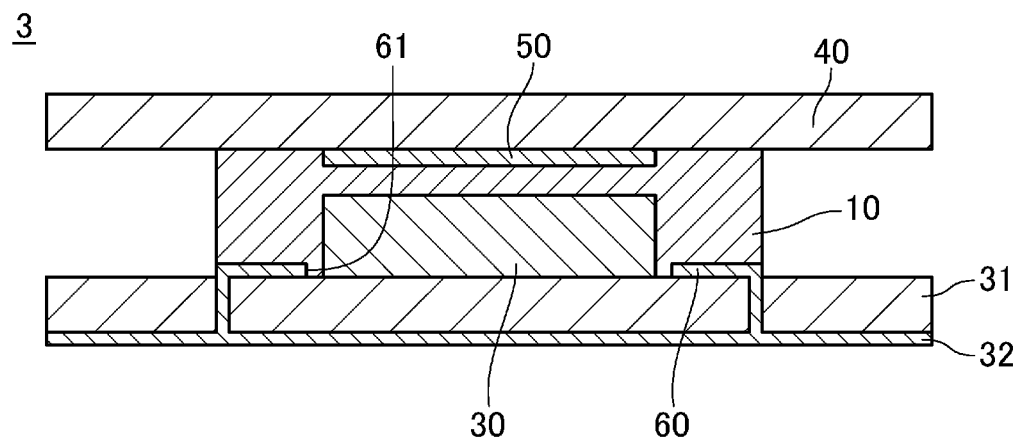
FIG. 6 is a cross-sectional view of another semiconductor device shown as an example of an electronic device according to the present technology.

As shown in FIG. 6, a ground pattern 60 having an opening 61 provided around the semiconductor element 30 may be provided in place of the electrically conductive shielding can 20. In a semiconductor device 3 shown in FIG. 6, the ground pattern 60 is formed on the substrate 31 so as to surround the semiconductor element 30. That is, in the semiconductor device 3, the opening 61 surrounding the semiconductor element 30 is provided in the ground pattern 60, and the semiconductor element 30 faces the insulating member 50 through the opening 61. The ground pattern 60 is connected to the ground 32 formed on the back surface of the substrate 31 through a through hole. The ground 32 may be formed in the inner layer of the substrate 31.

In the semiconductor device 3, the thermally and electrically conductive sheet 10 provided between the semiconductor element 30 and the electrically conductive cooling member 40 is connected to the ground pattern 60 formed on the surface of the substrate 31, whereby the ground pattern 60 and the electrically conductive cooling member 40 are electrically connected through the thermally and electrically conductive sheet 10.

In the semiconductor device 3, similarly to the semiconductor device 2 described above, it is preferable that the insulating member 50 has an area equal to or larger than the area of the semiconductor element 30 and is overlapped with the entire area of the semiconductor element 30 facing the semiconductor element via the opening 21. Thus, in the semiconductor device 3 as well, since the insulating member 50 is overlapped with the entire region of the semiconductor element 30, it is possible to make it more difficult for static electricity to flow through the semiconductor element 30.

Since the semiconductor device 3 is provided with the ground pattern 60 having the opening 61 provided around the semiconductor element 30 instead of the electrically conductive shielding can 20, the height of the semiconductor device 3 as a whole can be reduced while maintaining the electromagnetic wave suppression effect.

EXAMPLES

Next, examples of the present technology will be described. It should be noted that the present technology is not limited to the configuration of the examples described below. The semiconductor devices according to the following Examples 1, 2, and Reference Examples 1 to 3 were prepared, and heat dissipation, noise, ESD, thickness of the semiconductor device, and thermal resistance of the thermally conductive sheet were evaluated. Further, a semiconductor device according to Reference Example 4 was prepared, and the noise suppression effect of Example 1 was examined with reference to Reference Example 4.

In the description of Examples 1 and 2 and Reference Examples 1 to 4, the same members are denoted by the same reference numerals, and their details are omitted. In Examples 1 and 2 and Reference Examples 1 to 4, the measurement methods of thermal resistance and electric field strength are common.

Example 1

The configuration of Example 1 is the same as the configuration of the semiconductor device 1 shown in FIG. 1, and the arrangement and dimensions of the respective components are as follows.

Thermally and electrically conductive sheet 10: 18 mm×18 mm×0.27 mm thick on the electrically conductive shielding can 20; 16 mm×16 mm×0.95 mm thick on the semiconductor device Electrically conductive shielding can 20: 20 mm×20 mm×0.2 mm thick, opening: 16 mm×16 mm, height: 1.3 mm Semiconductor element 30: 16 mm×16 mm×0.7 mm thick Substrate 31: 30 mm×30 mm×0.65 mm thick Ground 32: 30 mm×30 mm×0.02 mm thick Microstrip line 35: 2 mm×1 mm×0.02 mm thick Electrically conductive cooling member 40: 30 mm×30 mm×0.3 mm thick Insulating member 50: 16 mm×16 mm×0.05 mm thick The distance between the electrically conductive cooling member 40 and the substrate 31 is 1.7 mm.

In the thermally and electrically conductive sheet 10, a two-part addition reaction type liquid silicone was used as a resin binder, Fe—Si—B—Cr amorphous magnetic particles having an average particle diameter of 5 μm was used as magnetic metal powders, pitch carbon fibers ("thermally conductive fiber" available from Nippon Graphite Fiber Co., Ltd.) having an average fiber length of 200 μm was used as fibrous thermally conductive fillers, and these were dispersed at a volume ratio of the two-part addition reaction type liquid silicone:amorphous magnetic particles:pitch carbon fibers=35 vol %:53 vol %:12 vol % to prepare a silicone composition (composition for the sheet) (bulk thermal conductivity: 5 W/mk). The resulting thermally and electrically conductive sheet 10 was measured for vertical thermal resistance (calculated by combining the thermal resistance of the interface and the internal thermal resistance) in accordance with ASTM D 5470.

The electrically conductive cooling member 40 is made of an aluminum plate. The electrically conductive shielding can 20 is made of stainless steel. The ground 32 and the microstrip line 35 are both copper wires. The signal line of the semiconductor element 30 is simplified by the microstrip line 35, and both ends are set as input/output ends of signals.

The main body (portion molded with resin) of the semiconductor element 30 is a dielectric having a relative dielectric constant of 4 and a dielectric loss tangent of 0.01.

The electromagnetic wave suppression effect was evaluated by calculating the maximum electric field strength at a position 3$m$ away from the semiconductor device using the three-dimensional electromagnetic field simulator ANSYS HFSS (manufactured by ANSYS), and expressed as the electric field strength with respect to the frequency (dBµV/m).

Example 2

The configuration of Example 2 is the same as the configuration of the semiconductor device 2 shown in FIG. 5, and the arrangement and dimensions of the respective components are as follows.

Thermally and electrically conductive sheet 10: 18 mm×18 mm×0.27 mm thick on the semiconductor element and the electrically conductive shielding can 20

Electrically conductive shielding can 20: 20 mm×20 mm×0.2 mm thick, opening; 16 mm×16 mm Semiconductor element 30: 16 mm×16 mm×0.7 mm thick Substrate 31: 30 mm×30 mm×0.65 mm thick Ground 32: 30 mm×30 mm×0.02 mm thick Microstrip line 35: 2 mm×1 mm×0.02 mm thick Electrically conductive cooling member 40: 30 mm×30 mm×0.3 mm thick Insulating member 50: 16 mm×16 mm×0.05 mm thick The distance between the electrically conductive cooling member 40 and the substrate 31 is 0.32 mm.

Reference Example 1

Figure 7:
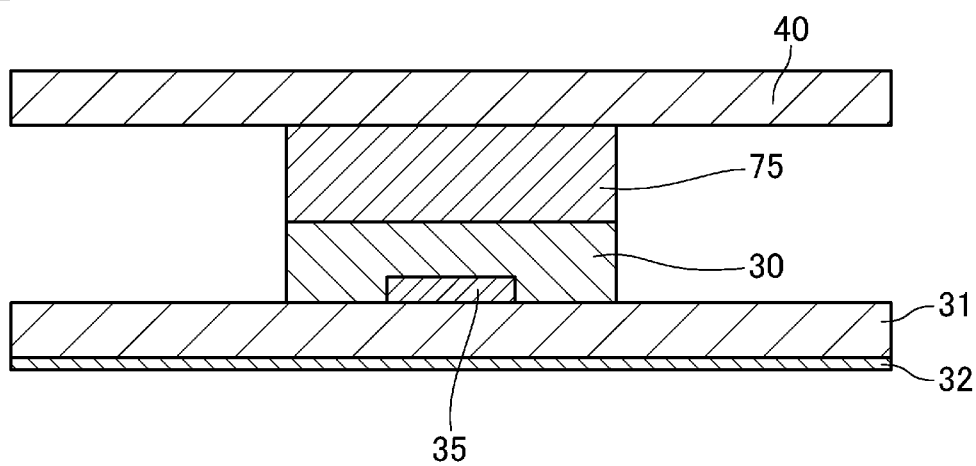
FIG. 7 is a cross-sectional view illustrating a semiconductor device according to a reference example of the present technology.

As Reference Example 1, a semiconductor device 70 is shown in FIG. 7. In the semiconductor device 70, the microstrip line 35 is formed on the surface of the substrate 31 having the ground 32 provided on the rear surface, and the semiconductor element 30 is mounted thereon. The semiconductor element 30 is connected to the electrically conductive cooling member 40 through a noise-suppressing thermally conductive sheet 75 (bulk thermal conductivity: 3 W/mk, permeability µr"=5). The noise-suppressing thermally conductive sheet 75 has the same structure as the thermally and electrically conductive sheet 10 except that the carbon fibers (electrically conductive filler) are not blended and the magnetic metal powder is mainly blended.

The arrangement and dimensions of respective components of the semiconductor device 70 are as follows.

Noise-suppressing thermally conductive sheet 75: 16 mm×16 mm×1.0 mm thick on the semiconductor element and the electrically conductive shielding can 20

Semiconductor element 30: 16 mm×16 mm×0.7 mm thick

Substrate 31: 30 mm×30 mm×0.65 mm thick

Ground 32: 30 mm×30 mm×0.02 mm thick

Microstrip line 35: 2 mm×1 mm×0.02 mm thick

Electrically conductive cooling member 40: 30 mm×30 mm×0.3 mm thick

The distance between the electrically conductive cooling member 40 and the substrate 71 is 1.7 mm.

Reference Example 2

Figure 8:
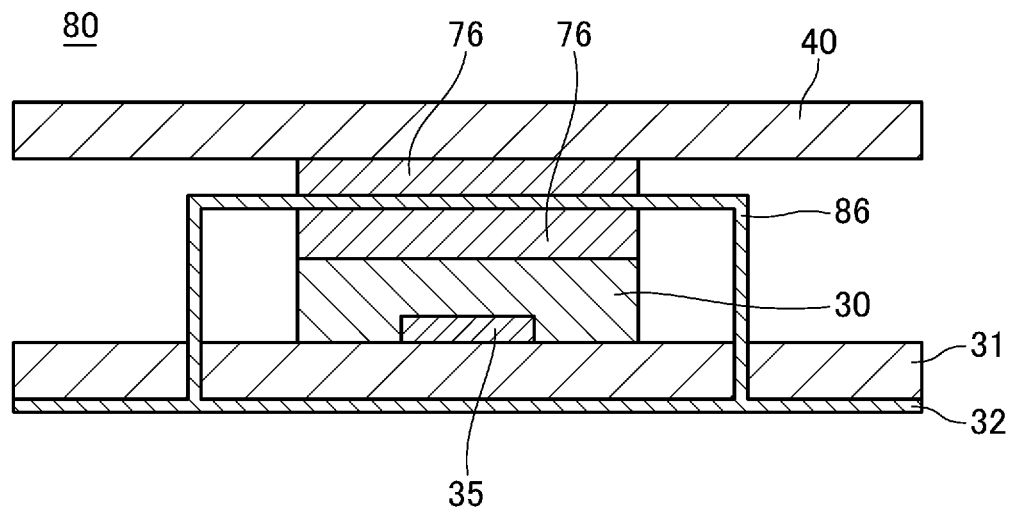
FIG. 8 is a cross-sectional view illustrating a semiconductor device according to a reference example of the present technology.

As Reference Example 2, a semiconductor device 80 is shown in FIG. 8. In the semiconductor device 80, the microstrip line 35 is formed on the surface of the substrate 31 having the ground 32 provided on the rear surface, and the semiconductor element 30 is mounted thereon. In the semiconductor device 80, the semiconductor element 30 is covered with an electrically conductive shielding can 86 having no opening. The electrically conductive shielding can 86 has the same structure as the electrically conductive shielding can 20 except that no opening is provided, and is connected to the ground 32. In the semiconductor device 80, an insulating thermally conductive sheet 76 (bulk thermal conductivity: 3 W/mk) is provided between the semiconductor element 30 and the electrically conductive shielding can 86, and between the electrically conductive shielding can 86 and the electrically conductive cooling member 40. The insulating thermally conductive sheet 76 has the same structure as the thermally and electrically conductive sheet 10 except that the carbon fiber (electrically conductive filler) is not blended and an inorganic filler is mainly blended.

The arrangement and dimensions of respective components of the semiconductor device 80 are as follows.

Insulating thermally conductive sheet 76: 16 mm×16 mm×0.4 mm thick on the semiconductor element and on the electrically conductive shielding can, respectively Electrically conductive shielding can 86: 20 mm×20 mm×0.2 mm thick Semiconductor element 30: 16 mm×16 mm×0.7 mm thick Substrate 31: 30 mm×30 mm×0.65 mm thick Ground 32: 30 mm×30 mm×0.02 mm thick Microstrip line 35: 2 mm×1 mm×0.02 mm thick Electrically conductive cooling member 40: 30 mm×30 mm×0.3 mm thick The distance between the electrically conductive cooling member 40 and the substrate 31 is 1.7 mm.

Reference Example 3

Figure 9:
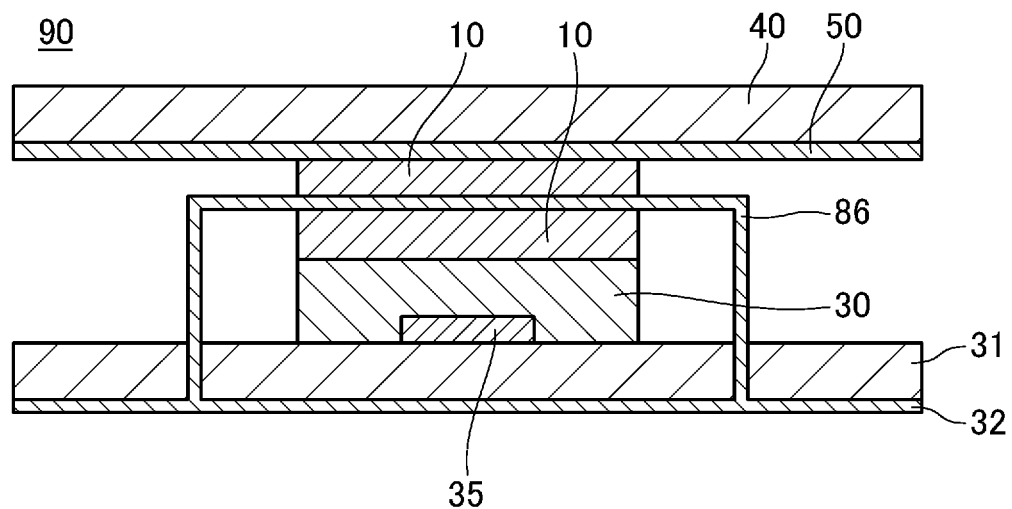
FIG. 9 is a cross-sectional view illustrating a semiconductor device according to a reference example of the present technology.

As Reference Example 3, a semiconductor device 90 is shown in FIG. 9. In the semiconductor device 90, the microstrip line 35 is formed on the surface of the substrate 31 having the ground 32 provided on the rear surface, and the semiconductor element 30 is mounted thereon. In the semiconductor device 90, the semiconductor element 30 is covered with an electrically conductive shielding can 86 having no opening. The electrically conductive shielding can 86 is connected to the ground 32. In the semiconductor device 90, the insulating member 50 is provided over the entire surface of the electrically conductive cooling member 40 facing the electrically conductive shielding can 86. In the semiconductor device 90, the thermally and electrically conductive sheet 10 (bulk thermal conductivity: 5 W/mk) is provided between the semiconductor element 30 and the electrically conductive shielding can 86, and between the electrically conductive shielding can 86 and the insulating member 50.

The arrangement and dimensions of respective components of the semiconductor device 90 are as follows.

Thermally and electrically conductive sheet 10: 16 mm×16 mm×0.35 mm thick on the electrically conductive shielding can; 16 mm×16 mm×0.4 mm thick on the semiconductor device Electrically conductive shielding can 86: 20 mm×20 mm×0.05 mm thick Semiconductor element 30: 16 mm×16 mm×0.7 mm thick Substrate 31: 30 mm×30 mm×0.65 mm thick Ground 32: 30 mm×30 mm×0.02 mm thick Microstrip line 35: 2 mm×1 mm×0.02 mm thick Electrically conductive cooling member 40: 30 mm×30 mm×0.3 mm thick Insulating member 50: 30 mm×30 mm×0.05 mm thick The distance between the electrically conductive cooling member 40 and the substrate 31 is 1.7 mm.

Reference Example 4

Figure 10:
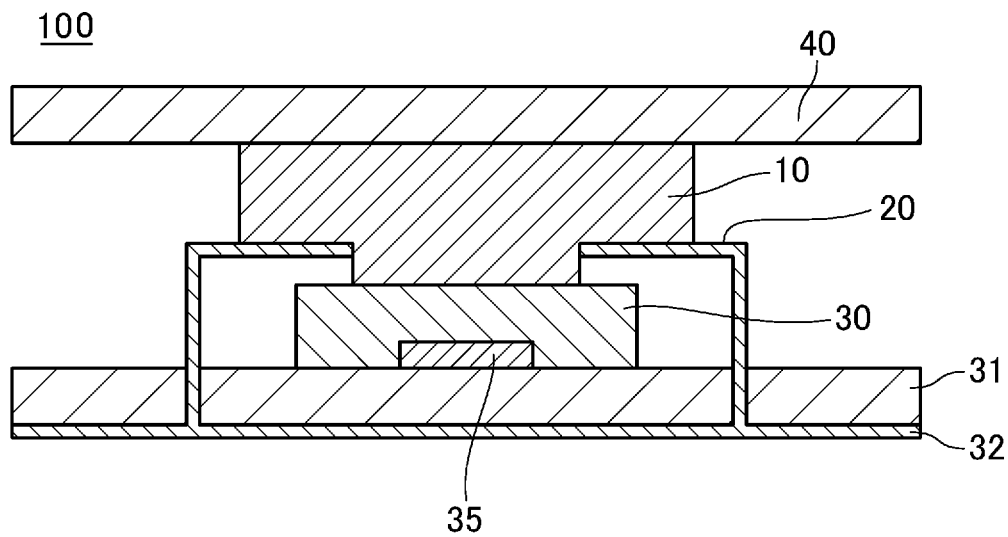
FIG. 10 is a cross-sectional view illustrating a semiconductor device according to a reference example of the present technology.

As Reference Example 4, a semiconductor device 100 is shown in FIG. 10. The semiconductor device 100 has the same structure as that of Example 1 except that the insulating member 50 is not provided, and the microstrip line 35 is formed on the front surface of the substrate 31 having the ground 32 provided on the back surface, and the semiconductor element 30 is mounted thereon. In the semiconductor device 100, the semiconductor element 30 is covered with the electrically conductive shielding can 20 provided with the opening 21. The electrically conductive shielding can 20 is connected to the ground 32. In the semiconductor device 100, the thermally and electrically conductive sheet 10 is provided between the semiconductor element 30 and the electrically conductive cooling member 40, and between the electrically conductive shielding can 20 and the electrically conductive cooling member 40.

The arrangement and dimensions of respective components of the semiconductor device 100 are as follows.

Thermally and electrically conductive sheet 10: 18 mm×18 mm×0.27 mm thick on the electrically conductive shielding can 20; 16 mm×16 mm×1.0 mm thick on the semiconductor device Electrically conductive shielding can 20: 20 mm×20 mm×0.2 mm thick, opening; 16 mm×16 mm Semiconductor element 30: 16 mm×16 mm×0.7 mm thick Substrate 31: 30 mm×30 mm×0.65 mm thick Ground 32: 30 mm×30 mm×0.02 mm thick Microstrip line 35: 2 mm×1 mm×0.02 mm thick Electrically conductive cooling member 40: 30 mm×30 mm×0.3 mm thick The distance between the electrically conductive cooling member 40 and the substrate 31 is 1.7 mm.

TABLE 1

| | heat dissipation | electromagnetic wave suppression | ESD | minimum thickness (mm) | thermal resistance (° C./W) |
|---|---|---|---|---|---|
| EX. 1 | G | G | G | 0.32 + h | 10.58 + α |
| EX. 2 | G | G | G | 0.32 | 10.58 |
| REF. 1 | G | B | B | 0.27 | 12.74 |
| REF. 2 | B | G | G | 0.59 | 15.12 |
| REF. 3 | I | I | G | 0.64 | 14.90 |

As shown in Table 1, in Examples 1 and 2, the heat dissipation, noise, and ESD protection measures were all good (hereinafter, denoted as "G"). That is, in Examples 1 and 2, since the opening 21 is formed in the electrically conductive shielding can 20, the thermally and electrically conductive sheet 10 having high thermal conductivity is provided between the semiconductor element 30 and the electrically conductive cooling member 40, and the insulating member 50 is also made of a material having high thermal conductivity, the thermal conduction to the electrically conductive cooling member 40 is greatly improved, so that excellent heat dissipation properties can be achieved.

Further, in Examples 1 and 2, a virtual shielding can for shielding the semiconductor element 30 is formed by the ground 32, the electrically conductive shielding can 20, the thermally and electrically conductive sheet 10, and the electrically conductive cooling member 40, so that electromagnetic wave shielding can be performed, thereby achieving an excellent electromagnetic wave suppressing effect.

Further, in Examples 1 and 2, since the electrically conductive shielding can 20 and the electrically conductive cooling member 40 are electrically connected through the thermally and electrically conductive sheet 10, the static electricity discharged to the electrically conductive cooling member 40 flows through the thermally and electrically conductive sheet 10 avoiding the insulating member 50 and flows to the ground 32 through the electrically conductive shielding can 20. Therefore, in Examples 1 and 2, it is possible to prevent the static electricity discharged to the electrically conductive cooling member 40 from being transmitted to electronic components such as the semiconductor element 30, and an excellent ESD protection is implemented.

Further, when considering the minimum thickness T from the semiconductor element 30 to the electrically conductive cooling member 40, Example 1 has at least a total thickness of 0.32 mm constituted by the thickness of the thermally and electrically conductive sheet 10 (0.27 mm) on the top surface 20a of the electrically conductive shielding can 20 and the thickness of the electrically conductive shielding can 20 (0.05 mm) and the height (h) between the opening 21 of the electrically conductive shielding can 20 plus the semiconductor element 30 (0.32 mm+h). In this case, the thermal resistance between the semiconductor element 30 and the electrically conductive cooling member 40 is 10.58° C./W plus the thermal resistance value α of the thickness h component (10.58+α° C./W). In Example 2, since the semiconductor element 30 and the top surface 20a of the electrically conductive shielding can 20 are flush with each other, the total thickness is 0.32 mm constituted by the thickness of the thermally and electrically conductive sheet 10 (0.27 mm) on the top surface 20a of the electrically conductive shielding can 20 and the thickness of the electrically conductive shielding can 20 (0.05 mm). In this case, the thermal resistance between the semiconductor element 30 and the electrically conductive cooling member 40 was 10.58° C./W.

In Reference Example 1, since the heat of the semiconductor element 30 can be radiated to the electrically conductive cooling member 40 by the noise-suppressing thermally conductive sheet 75, heat dissipation measures are implemented. However, since the electrically conductive shielding can 20 is not provided and the noise-suppressing thermally conductive sheet 75 is thin, the electromagnetic wave suppressing effect is degraded and thus the electromagnetic wave suppressing measures are not sufficient (BAD, hereinafter denoted as "B"). Further, since the static electricity discharged to the electrically conductive cooling member 40 is transmitted to the semiconductor element 30 through the noise-suppressing thermally conductive sheet 75, a necessary ESD protection is not implemented (B). The minimum thickness T is equal to the thickness of the noise-suppressing thermally conductive sheet 75 (0.27 mm). In this case, the thermal resistance between the semiconductor element 30 and the electrically conductive cooling member 40 was 12.74° C./W.

Further, in Reference Example 2, the electrically conductive shielding can 20 is not provided with the opening, so that the contact area between the insulating thermally conductive sheet 76 and the electrically conductive shielding can 20 is increased, and the thermal conductivity is inhibited. The insulating thermally conductive sheet 76 has a lower thermal conductivity than the thermally and electrically conductive sheet 10. Therefore, the heat generated by the semiconductor element 30 is hardly transmitted to the electrically conductive cooling member 40, and necessary heat dissipation measures are not implemented (B). It should be noted that Reference Example 2 has sufficient electromagnetic wave suppression measures by providing the electrically conductive shielding can 20 (G), and ESD protection measures are also implemented by using the insulating thermally conductive sheet 76 (G). However, in Reference Example 2, since the insulating thermally conductive sheets 76 are disposed above and below the electrically conductive shielding can 20, the minimum thickness T is 0.59 mm in total, which is the sum of thickness of the two thermally and electrically conductive sheets 10 (0.27 mm×2) and the thickness of the electrically conductive shielding can 20 (0.05 mm). In this case, the thermal resistance between the semiconductor element 30 and the electrically conductive cooling member 40 was 15.12° C./W.

In Reference Example 3, the electrically conductive shielding can 20 is not provided with the opening, so that the contact area between the insulating thermally conductive sheet 76 and the electrically conductive shielding can 20 is increased, and the thermal conductivity is inhibited. Therefore, although the thermally and electrically conductive sheet 10 having a thermal conductivity higher than that of the insulating thermally conductive sheet 76 is used, it is insufficient (denoted as "I") as heat dissipation measures. Further, in Reference Example 3, since the electrically conductive shielding can 20 connected to the ground 32 and the electrically conductive cooling member 40 are insulated from each other by the insulating member 50 provided on the entire surface of the electrically conductive cooling member 40, the electrically conductive cooling member 40 itself can function as an antenna. Therefore, it can be said to be insufficient (I) as electromagnetic wave control measures. It should be noted that, in Reference Example 3, since the insulating member 50 is provided on the entire surface of the electrically conductive cooling member 40, ESD protection measures are implemented (G). However, in Reference Example 3, since the insulating thermally conductive sheets 76 are disposed above and below the electrically conductive shielding can 20, and the insulating member 50 is arranged over the entire surface of the electrically conductive cooling member 40, the minimum thickness T is 0.64 mm in total, which is the sum of thickness of the two thermally and electrically conductive sheets 10 (0.27 mm×2), the thickness of the electrically conductive shielding can 20 (0.05 mm), and the thickness of the insulating member 50 (0.05 mm). In this case, the thermal resistance between the semiconductor element 30 and the electrically conductive cooling member 40 was 14.90° C./W.

Since the semiconductor device 100 shown in Reference Example 4 has the same structure as that of Example 1 except that the insulating member 50 is not provided, heat dissipation measures and electromagnetic wave suppression measures other than ESD protection measures are implemented (G).

Next, the electric field characteristics of the semiconductor device according to Examples and Reference Examples will be described with reference to FIGS. 11 to 13.

Figure 11:
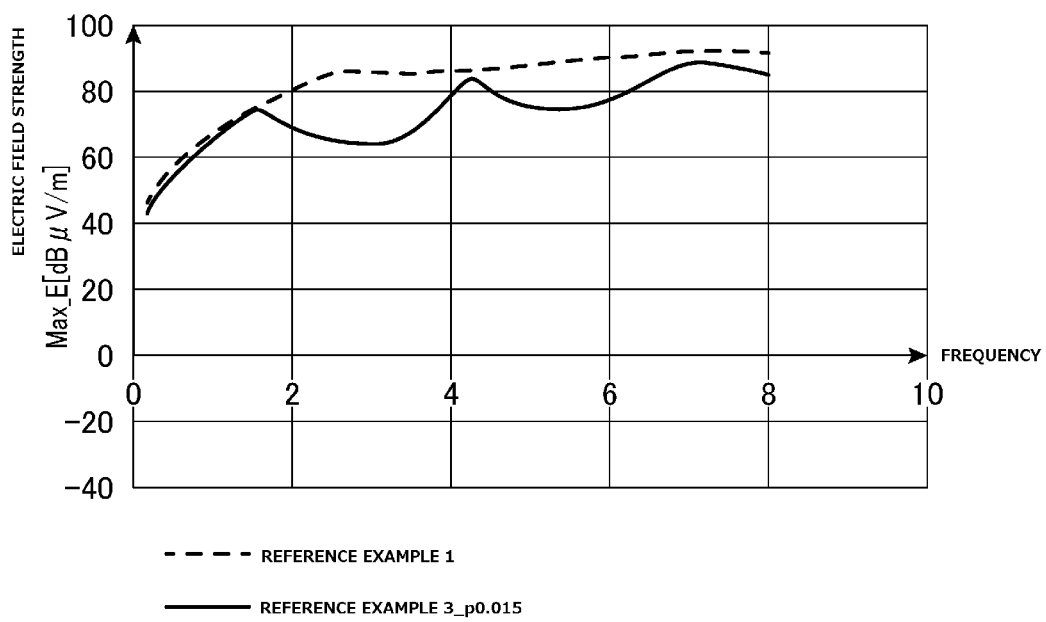
FIG. 11 is a graph showing the electric field strength characteristics of the semiconductor devices according to Reference Examples 1 and 3.

FIG. 11 is a graph showing simulation results of electric field strength characteristics measured by setting the magnetic permeability μr″ of the noise-suppressing thermally conductive sheet 75 of Reference Example 1 to 5 (500 MHz) and the volume resistivity of the thermally and electrically conductive sheet 10 of Reference Example 3 to 0.015 [Ω*m]. As described above, in Reference Example 1, measures for suppressing electromagnetic waves are insufficient, and it is understood that a high electric field strength is measured and noise is not suppressed. In Reference Example 3, although the shielding can 20 is provided, because the electrically conductive cooling member 40 itself functions as an antenna, although the electric field strength decreases in some frequency bands, a high electric field strength is consistently measured, and it is understood that noise suppression is insufficient.

Figure 12:
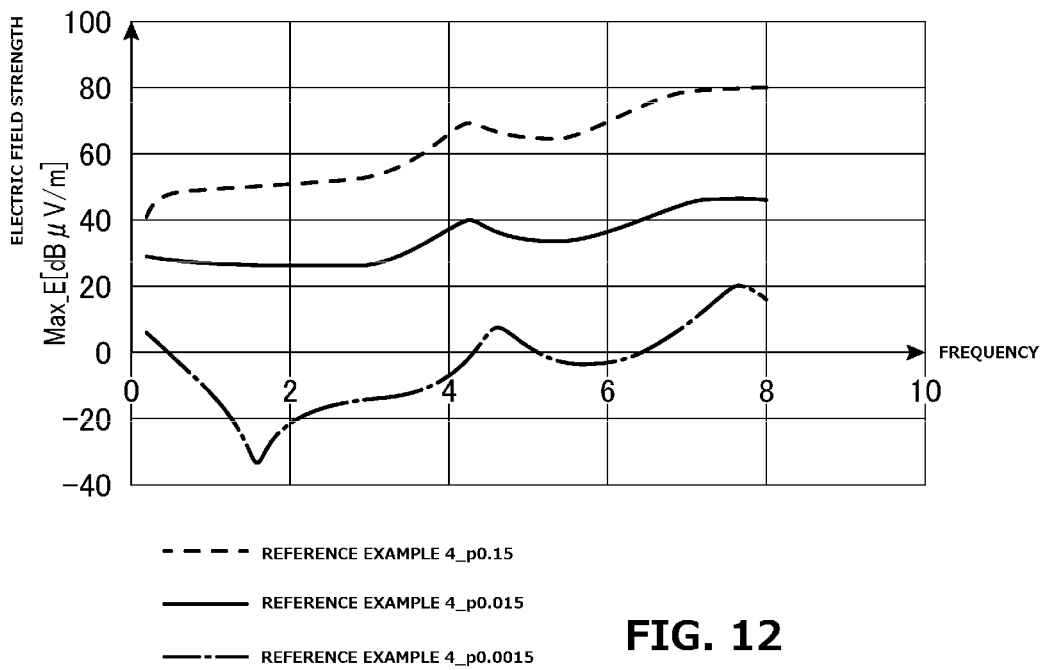
FIG. 12 is a graph showing the electric field strength characteristics of the semiconductor device according to Reference Example 4.

FIG. 12 is a graph showing simulation results of electric field strength characteristics measured by setting the volume resistivity of the thermally and electrically conductive sheet 10 of the Reference Example 4 to 0.15 [Ω*m], 0.015 [Ω*m], and 0.0015 [Ω*m]. It can be seen that the electric field strength is lower than in Reference Examples 1 and 3 and noise is suppressed. Further, as the volume resistivity of the thermally and electrically conductive sheet 10 decreases, the electric field strength also decreases and noise can be suppressed.

Figure 13:
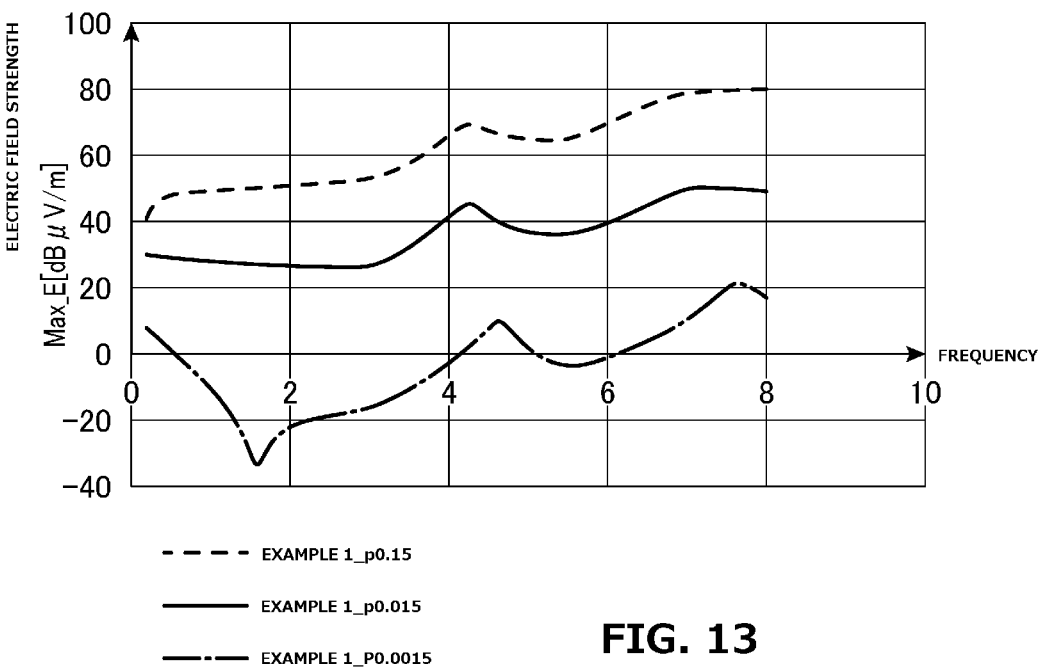
FIG. 13 is a graph showing the electric field strength characteristics of the semiconductor device according to Example 1.

FIG. 13 is a graph showing simulation results of electric field strength characteristics measured by setting the volume resistivity of the thermally and electrically conductive sheet 10 of Example 1 to 0.15 [Ω*m], 0.015 [Ω*m], and 0.0015 [Ω*m]. It can be seen that Example 1 also has the same electric field strength/frequency characteristic as that of Reference Example 4 shown in FIG. 12, and exhibits a particularly good electromagnetic wave suppression effect when the volume resistivity of the thermally and electrically conductive sheet 10 is 0.15 Ω*m or less.

DESCRIPTION OF REFERENCE CHARACTERS

1 to 3 semiconductor device, 10 thermally and electrically conductive sheet, 10a projection, 10b body, 20 electrically conductive shielding can, 21 opening, 30 semiconductor device, 31 substrate, 32 ground, 33 land, 35 microstrip line, 40 electrically conductive cooling member, 50 insulating member, 60 ground, 61 opening, 70 semiconductor device, 76 insulating thermally conductive sheet, 80 semiconductor device, 86 electrically conductive shielding can, 90 semiconductor device, 100 semiconductor device

What is claimed is:

1. An electronic device comprising:
    an electronic component provided on a substrate;
    an electrically conductive shielding can having an opening and provided so as to surround the electronic component and connected to a ground;
    an electrically conductive cooling member provided on an upper portion of the electrically conductive shielding can;
    a thermally and electrically conductive sheet provided between the electronic component and the electrically conductive cooling member; and
    an insulating member provided between the thermally and electrically conductive sheet and the electrically conductive cooling member and facing the electronic component through the opening,
    wherein the insulating member has a size equal to or larger than a region of the electronic component facing the insulating member through the opening, and
    wherein the electrically conductive shielding can is electrically connected to the electrically conductive cooling member through the thermally and electrically conductive sheet.

2. The electronic device according to claim 1,
    wherein the thermally and electrically conductive sheet is provided on a top surface of the electrically conductive shielding can provided with the opening, and wherein the thermally and electrically conductive sheet is larger than the insulating member and the opening.

3. The electronic device according to claim 1, wherein the opening is smaller than the electronic component and exposes a part of the electronic component to an outside.

4. The electronic device according to claim 1, wherein the opening has a size equal to or larger than that of the electronic component and exposes an entirety of the electronic component to an outside.

5. The electronic device according to claim 1, wherein the insulating member covers the entire region of the electronic component facing therewith through the opening.

6. The electronic device according to claim 1, wherein the thermally and electrically conductive sheet has a larger electrical resistance in an in-plane direction than a thickness direction crossing the electrically conductive shielding can and the electrically conductive cooling member.

7. The electronic device according to claim 6, wherein a ratio of an electrical resistance in an in-plane direction to an electrical resistance in a thickness direction is 100 or more.

8. The electronic device according to claim 1, wherein the thermally and electrically conductive sheet contains magnetic metal powder.

9. The electronic device according to claim 1, wherein the insulating member is a thermally conductive ceramic.

10. The electronic device according to claim 1, wherein the insulating member is formed on the electrically conductive cooling member.

11. The electronic device according to claim 1, wherein the electronic component is a semiconductor device formed on the substrate.

12. The electronic device according to claim 1, wherein the electrically conductive cooling member is a heat sink or an electronic device housing.

13. The electronic device according to claim 1, wherein the thermally and electrically conductive sheet has flexibility and tackiness.

14. The electronic device according to claim 1, wherein a volume resistivity of the thermally and electrically conductive sheet is 0.15 $\Omega$*m or less.

15. The electronic device according to claim 1, wherein the thermally and electrically conductive sheet has a thermal conductivity of 5 W/m*K or more.

16. An electronic device comprising:
an electronic component provided on a substrate;
a ground pattern having an opening and provided so as to surround the electronic component and connected to a ground;
an electrically conductive cooling member provided on an upper portion of the ground pattern;
a thermally and electrically conductive sheet provided between the electronic component and the electrically conductive cooling member; and
an insulating member provided between the thermally and electrically conductive sheet and the electrically conductive cooling member and facing the electronic component through the opening,
wherein the insulating member has a size equal to or larger than a region of the electronic component facing the insulating member through the opening, and
wherein the ground pattern and the electrically conductive cooling member are electrically connected to each other via the thermally and electrically conductive sheet.

* * * * *